United States Patent
Kim et al.

(10) Patent No.: US 8,263,237 B2
(45) Date of Patent: Sep. 11, 2012

(54) RED PHOSPHORESCENT COMPOSITION AND ORGANIC ELECTROLUMINESCENT DEVICE USING THE SAME

(75) Inventors: Jung-Keun Kim, Seoul (KR); Do-Han Kim, Goyang-si (KR); Chun-Gun Park, Seoul (KR); Jong-Kwan Bin, Gyeonggi-do (KR); Soon-Wook Cha, Goyang-si (KR); Seung-Jae Lee, Goyang-si (KR); In-Bum Song, Uijeongbu-si (KR)

(73) Assignee: LG Display Co., Ltd, Seoul (KR)

( * ) Notice: Subject to any disclaimer, the term of this patent is extended or adjusted under 35 U.S.C. 154(b) by 400 days.

(21) Appl. No.: 12/588,405

(22) Filed: Oct. 14, 2009

(65) Prior Publication Data

US 2010/0102714 A1    Apr. 29, 2010

(30) Foreign Application Priority Data

Oct. 29, 2008    (KR) .................. 10-2008-0106547

(51) Int. Cl.
*H01L 51/54*    (2006.01)
*C09K 11/06*    (2006.01)

(52) U.S. Cl. ........ 428/690; 428/917; 313/504; 313/506; 257/E51.044; 252/301.16; 546/10

(58) Field of Classification Search .................. None
See application file for complete search history.

(56) References Cited

U.S. PATENT DOCUMENTS

| | | | |
|---|---|---|---|
| 6,835,469 B2 | 12/2004 | Kwong et al. | |
| 2001/0019782 A1* | 9/2001 | Igarashi et al. | 428/690 |
| 2003/0068536 A1* | 4/2003 | Tsuboyama et al. | 428/704 |
| 2005/0196637 A1* | 9/2005 | Herron | 428/690 |
| 2006/0127696 A1* | 6/2006 | Stossel et al. | 428/690 |

* cited by examiner

*Primary Examiner* — Marie R. Yamnitzky
(74) *Attorney, Agent, or Firm* — McKenna Long & Aldridge LLP

(57) ABSTRACT

A red phosphorescent compound, includes a host material being capable of transporting an electron or a hole; and a dopant material represented by the following formula 1:

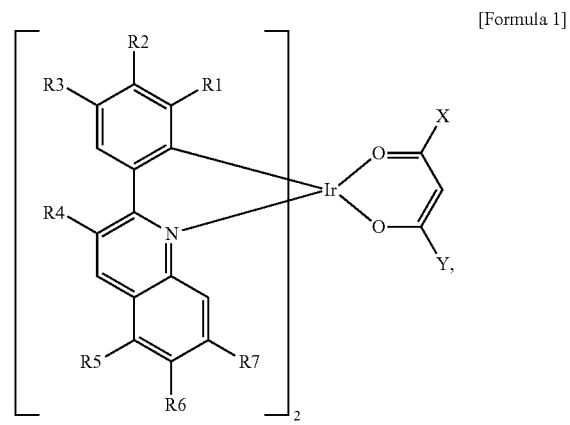

[Formula 1]

wherein each of R1 to R4 is selected from the group consisting of hydrogen atom (H), C1 to C6 alkyl and C1 to C6 alkoxy, and at least one of R1 to R4 is C1 to C6 alkyl, and wherein each of R5 to R7 is selected from the group consisting of hydrogen, C1 to C6 alkyl and pyrrole, and at least one of R5 to R7 is pyrrole, and wherein each of X and Y is selected from the group consisting of H, non-substituted C1 to C6 alkyl and C1 to C6 alkyl substituted by fluorine.

17 Claims, 2 Drawing Sheets

RED PHOSPHORESCENT COMPOSITION AND ORGANIC ELECTROLUMINESCENT DEVICE USING THE SAME

The present application claims the benefit of Korean Patent Application No. 10-2008-0106547 filed in Korea on Oct. 29, 2008, which is hereby incorporated by reference for all purposes as if fully set forth herein.

BACKGROUND OF THE INVENTION

1. Field of the Invention

The present invention relates to a red phosphorescent compound and an organic electroluminescent device (OELD) and more particularly to a red phosphorescent compound having high color purity, high luminescent efficiency and improved lifetime and an OELD using the red phosphorescent compound.

2. Discussion of the Related Art

Recently, a requirement for a flat panel display device having a relatively large display area and a relatively small occupancy has been increased. Among the flat panel display devices, an OELD has various advantages as compared to an inorganic electroluminescent device, a liquid crystal display device, a plasma display panel, and so on. The OELD device has excellent characteristics of viewing angle, contrast ratio, and so on. Also, since the OELD device does not require a backlight assembly, the OELD device has low weight and low power consumption. Moreover, the OELD device has advantages of high response rate, low production, cost and so on.

In general, the OELD emits light by injecting electrons from a cathode and holes from an anode into an emission compound layer, combining the electrons with the holes, generating an exciton, and transforming the exciton from an excited state to a ground state. A flexible substrate, for example, a plastic substrate, can be used as a base substrate where elements are formed. The OELD has excellent characteristics of viewing angle, contrast ratio, and so on. Also, since the OELD does not require a backlight assembly, the OELD has low weight and low power consumption. Moreover, the OELD has advantages of a high response rate, low production cost, high color purity, and so on. The OELD can be operated at a voltage (e.g., 10V or below) lower than a voltage required to operate other display devices. In addition, the OELD is adequate to produce full-color images.

A general method for fabricating OELDs will be briefly explained below. First, an anode is formed on a substrate by depositing a transparent conductive compound, for example, indium-tin-oxide (ITO). Next, a hole injection layer (HIL) is formed on the anode. For example, the HIL may be formed of copper phthalocyanine (CuPC) and have a thickness of about 10 nm to about 30 nm. Next, a hole transporting layer (HTL) is formed on the HIL. For example, the HTL may be formed of 4,4'-bis[N-(1-naphthyl)-N-phenylamino]-biphenyl (NPB) and have a thickness of about 30 nm to about 60 nm. Next, an emitting compound layer (EML) is formed on the HTL. A dopant may be doped onto the EML. In a phosphorescent type, the EML may be formed of 4,4'-N,N'-dicarbazole-biphenyl (CBP) and have a thickness of about 30 nm to about 60 nm, and the dopant may includes one of iridium complex represented by following Formulas 1-1 to 1-3.

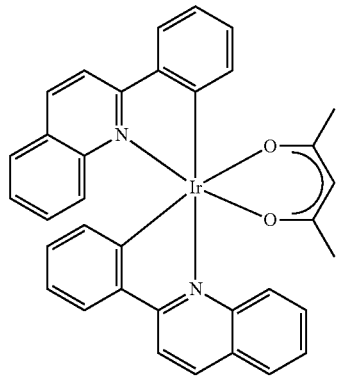

[Formula 1-1]

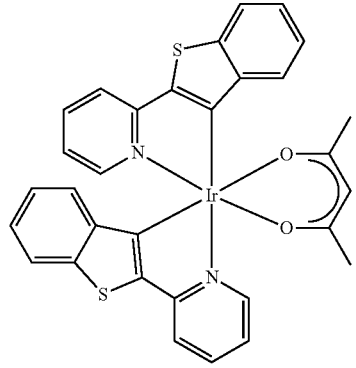

[Formula 1-2]

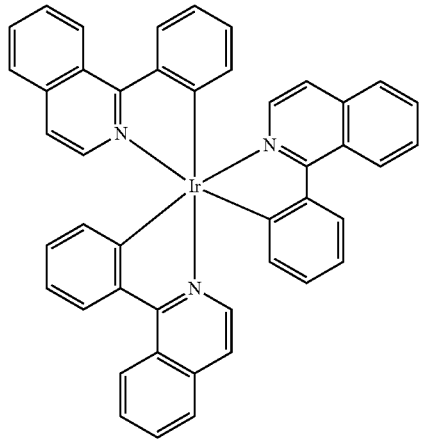

[Formula 1-3]

Next, an electron transporting layer (ETL) and an electron injection layer (EIL) are stacked on the EML. For example, the ETL may be formed of tris(8-hydroxy-quinolate)aluminum (Alq3). A cathode is formed on the EIL, and a passivation layer is formed on the cathode.

In the above structure, the EML produces red, green and blue colors such that the OELD can display full-color images. In an emitting compound, an exciton is generated by combining the electrons from a cathode and holes from an anode. The exciton includes a singlet exciton and a triplet exciton. The singlet exciton participates in a fluorescent type emission, while the triplet exciton participates in a phosphorescent type emission. The singlet exciton has a formation probability of about 25%, while the triplet exciton has a formation probability of about 75%. Accordingly, the phosphorescent type emission has luminescence efficiency greater than the fluorescent type emission.

In the phosphorescent compound, since a red phosphorescent compound has excellent luminescence efficiency as compared to a red fluorescent compound, the red phosphorescent compound has been widely developed and researched to improve an emission efficiency of the OELD. The phosphorescent compound is required to have high luminescence efficiency, high color purity, long life span, and so on. Particularly, as shown in FIG. 1, as the color purity of an OELD using a red phosphorescent material becomes higher (i.e. as the X index on CIE chromaticity coordinates increase), the relative spectral sensitivity of images from the OELD decreases. Accordingly, it is difficult to achieve high luminance efficiency of the OELD.

SUMMARY OF THE INVENTION

Accordingly, the present invention is directed to a red phosphorescent compound and an organic electroluminescent device (OELD) using the same that substantially obviates one or more of the problems due to limitations and disadvantages of the related art.

An object of the present invention is to provide a red phosphorescent compound having high color purity (e.g., X index of CIE chromaticity coordinates being greater than 0.65), high luminescence efficiency, and long lifetime.

Another object of the present invention is to provide an OELD device using the red phosphorescent compound.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a red phosphorescent composition, includes a host material being capable of transporting an electron or a hole; and a dopant material represented by following Formula 1:

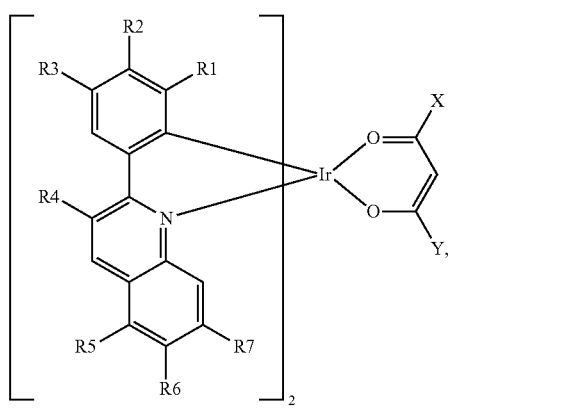

[Formula 1]

wherein each of R1 to R4 is selected from the group consisting of hydrogen atom (H), C1 to C6 alkyl and C1 to C6 alkoxy, and at least one of R1 to R4 is C1 to C6 alkyl, and wherein each of R5 to R7 is selected from the group consisting of hydrogen, C1 to C6 alkyl and pyrrole, and at least one of R5 to R7 is pyrrole, and wherein each of X and Y is selected from the group consisting of H, non-substituted C1 to C6 alkyl and C1 to C6 alkyl substituted by fluorine, wherein nitrogen of pyrrole in at least one of R5 to R7 is combined with quinoline in the Formula 1.

In another aspect of the present invention, an organic electroluminescent device includes a first substrate; a thin film transistor on the first substrate; a second substrate facing the first substrate; and an organic luminescent diode electrically connected to the thin film transistor and including a first electrode, a second electrode facing the first electrode and an organic emission layer disposed between the first and second electrodes, a red phosphorescent composition of the organic emission layer including a host material being capable of transporting an electron or a hole; and a dopant material represented by following Formula 1:

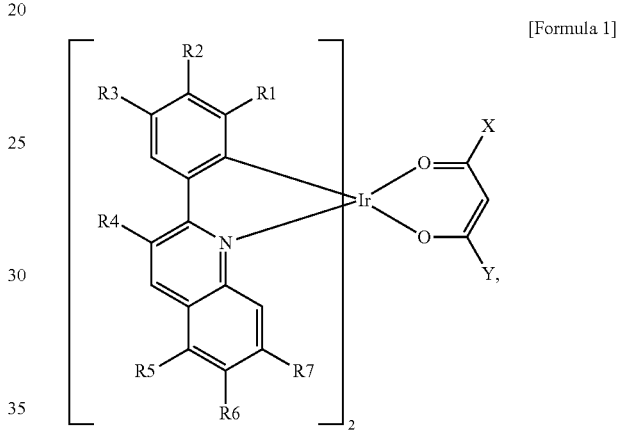

[Formula 1]

wherein each of R1 to R4 is selected from the group consisting of hydrogen atom (H), C1 to C6 alkyl and C1 to C6 alkoxy, and at least one of R1 to R4 is C1 to C6 alkyl, and wherein each of R5 to R7 is selected from the group consisting of hydrogen, C1 to C6 alkyl and pyrrole, and at least one of R5 to R7 is pyrrole, and wherein each of X and Y is selected from the group consisting of H, non-substituted C1 to C6 alkyl and C1 to C6 alkyl substituted by fluorine, wherein nitrogen of pyrrole in at least one of R5 to R7 is combined with quinoline in the Formula 1.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Figure 1:
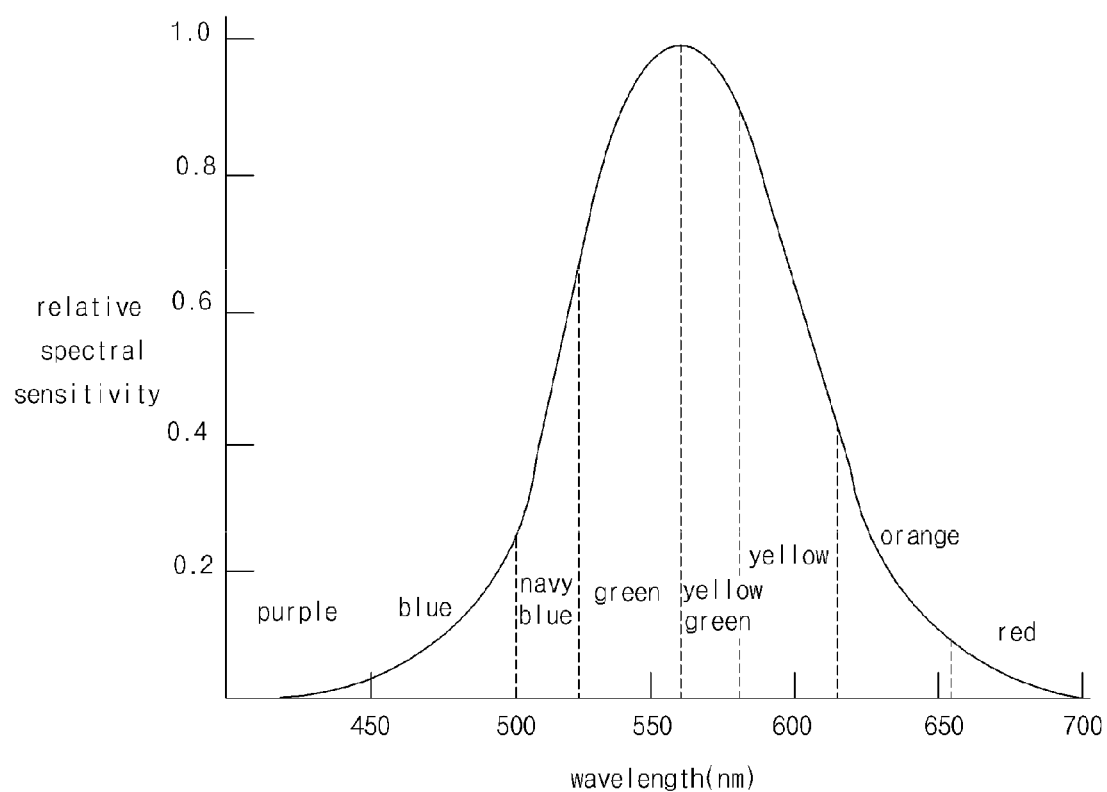
FIG. 1 is a graph showing a relation of a color purity and a visible degree.

Reference will now be made in detail to the preferred embodiments, examples of which are illustrated in the accompanying drawings.

A red phosphorescent compound includes at least one alkyl, which is substituted in a phenyl part, and at least one pyrrole, which is substituted in a quinoline part, such that the red phosphorescent compound has improved color purity, luminescence efficiency and life time. The red phosphorescent compound is represented by the following Formula 2.

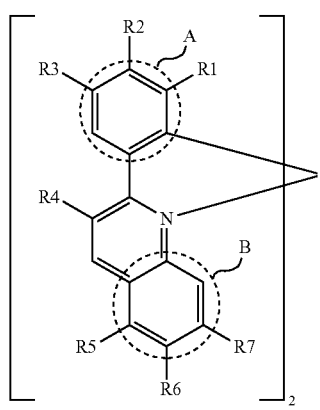

[formula 2]

In the above Formula 2, each of R1 to R4 is selected from the group consisting of hydrogen atom (H), C1 to C6 alkyl and C1 to C6 alkoxy. In addition, at least one of R1 to R4 is C1 to C6 alkyl. Each of R5 to R7 is selected from the group consisting of H, C1 to C6 alkyl and pyrrole. In addition, at least one of R5 to R7 is pyrrole.

As mentioned above, at least one alkyl is substituted in a first phenyl part "A" such that the red phosphorescent compound has improved color purity and luminescence efficiency. In addition, at least one pyrrole is substituted in a second phenyl part "B", which is not substituted by nitrogen, in a quinoline part such that the red phosphorescent compound has further improved color purity and luminescence efficiency and elongated lifetime.

In Formula 2, each of X and Y is selected from the group consisting of H, non-substituted C1 to C6 alkyl and C1 to C6 alkyl substituted by fluorine.

For example, the C1 to C6 alkyl may be selected from the group consisting of methyl, ethyl, n propyl, i-propyl, n-butyl, i-butyl and t-butyl, and the C1 to C6 alkoxy may be selected from the group consisting of methoxy, ethoxy, n-propoxy, i-propoxy, n-butoxy, i-butoxy and t-butoxy.

As a result, in the above Formula 2, a left side structure of central iridium (Ir) is selected from the following Formula 3.

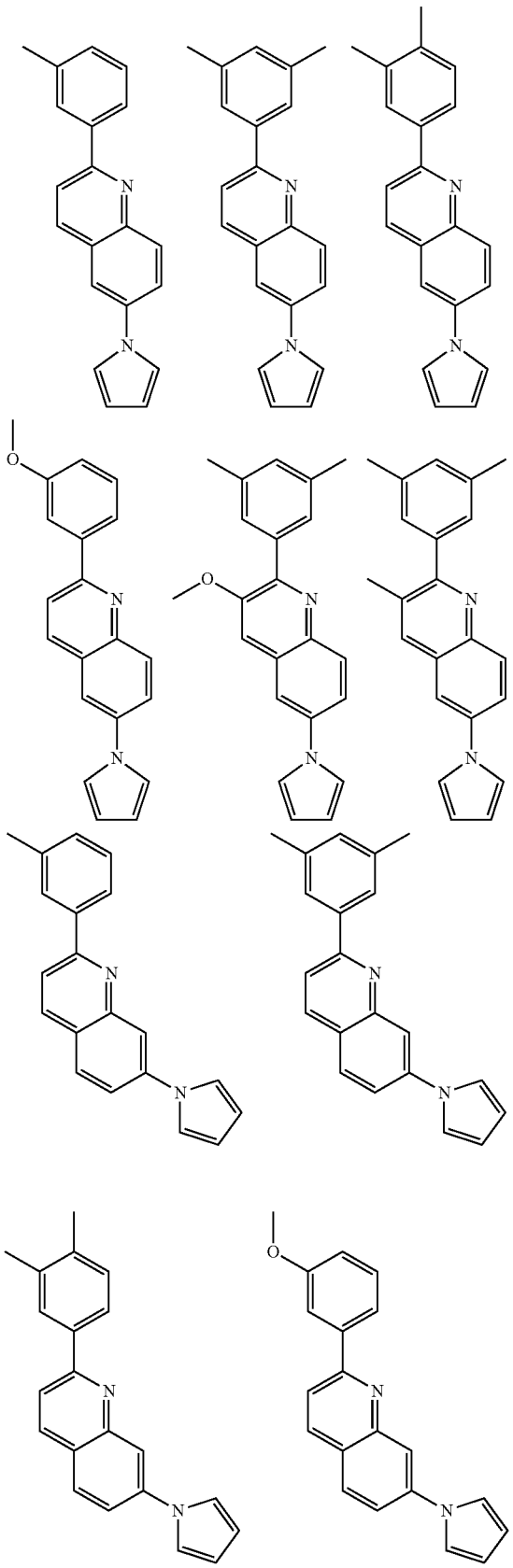

[Formula 3]

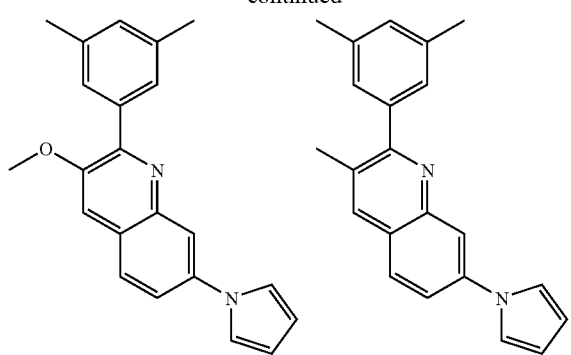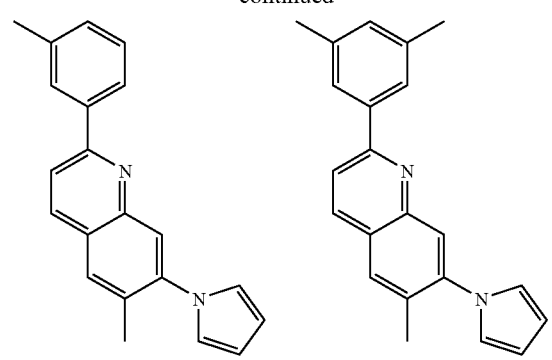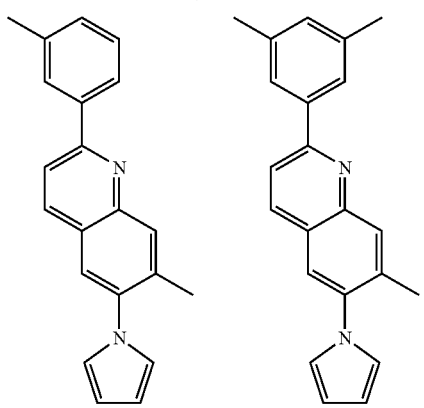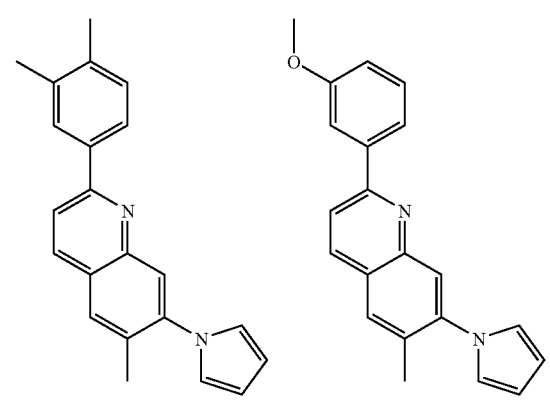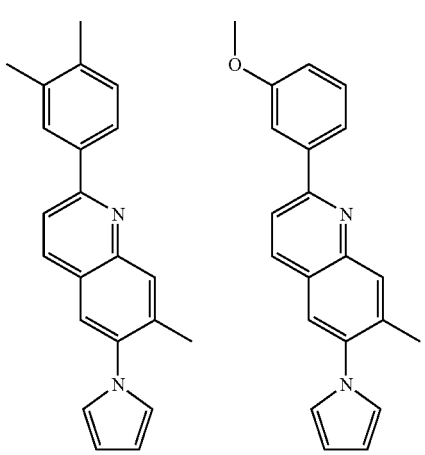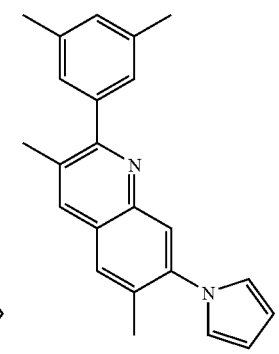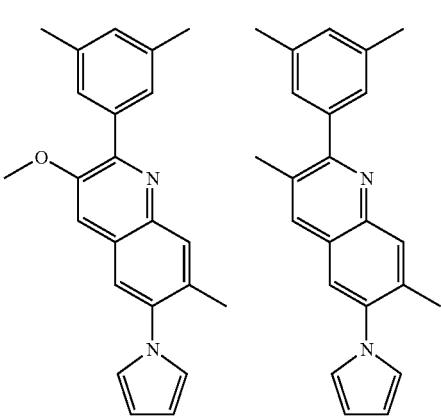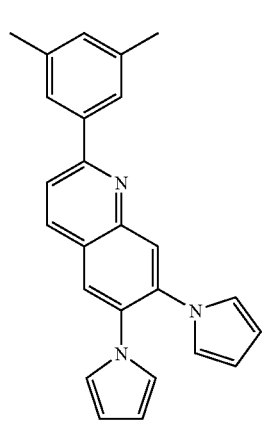

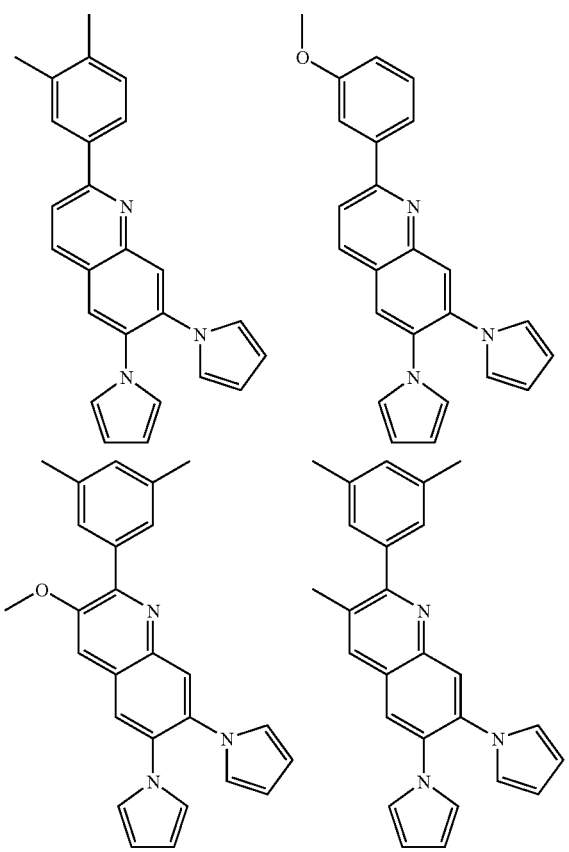

In addition, in the above Formula 2, a right side structure of central iridium (Ir) is selected from the following Formulas 4-1 to 4-8. The structures of the Formulas 4-1 to 4-8 are 2,4-pentanedione, 2,2,6,6-tetramethylheptane-3,5-dione, 1,3-propanedione, 1,3-butanedione, 3,5-heptanedione, 1,1,1-trifluoro-2,4-pentanedione, 1,1,1,5,5,5-hexafluoro-2,4-pentanedione and 2,2-dimethyl-3,5-hexanedione, respectively.

[Formula 4-1]
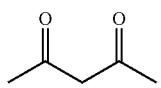

[Formula 4-2]
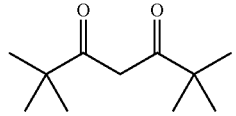

[Formula 4-3]
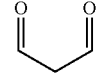

[Formula 4-4]
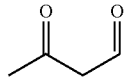

[Formula 4-5]
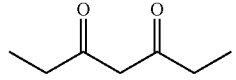

[Formula 4-6]
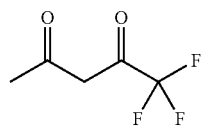

[Formula 4-7]
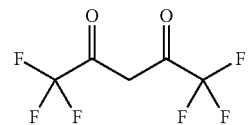

[Formula 4-8]
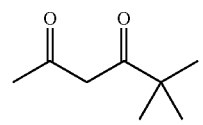

As a result, the red phosphorescent compound represented by Formula 2 is selected from the following Formula 5. For convenience of explanation, the references of A1 to A60 are marked on each compound.

[Formula 5]

A-1
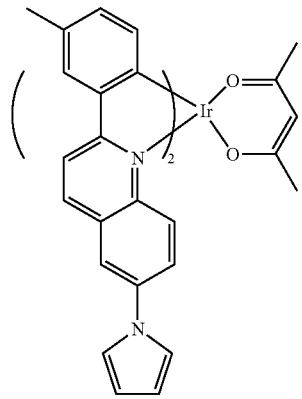

A-2
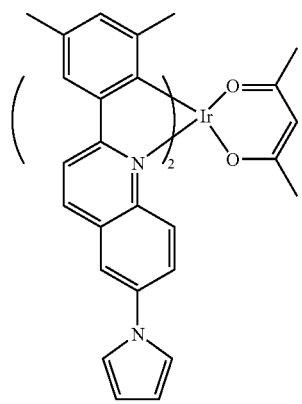

A-3
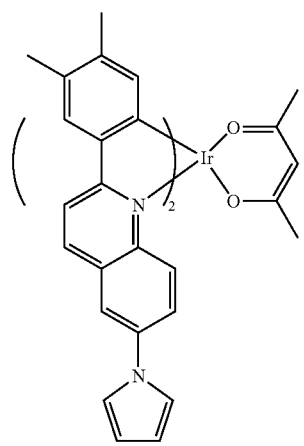
A-4
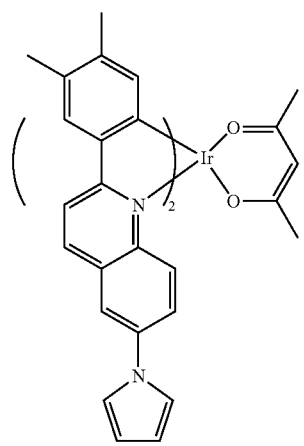
A-5
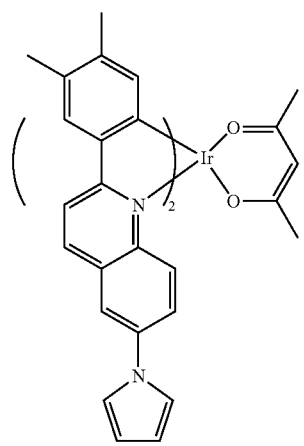
A-6
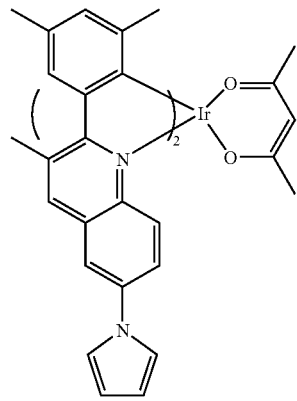
A-7
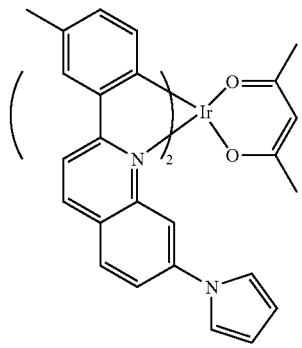
A-8
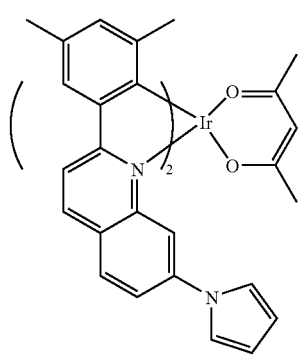
A-9
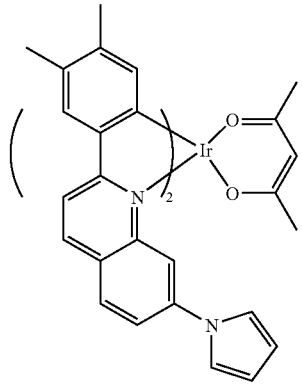

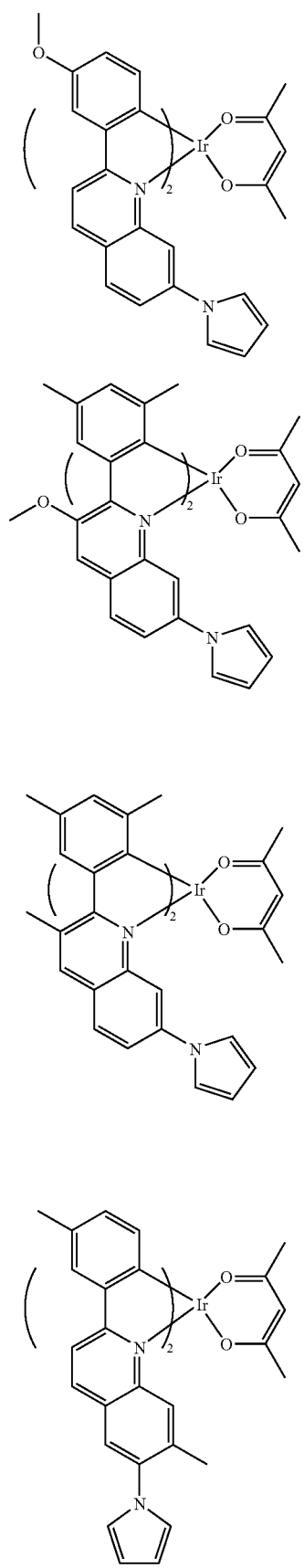
A-10
A-11
A-12
A-13
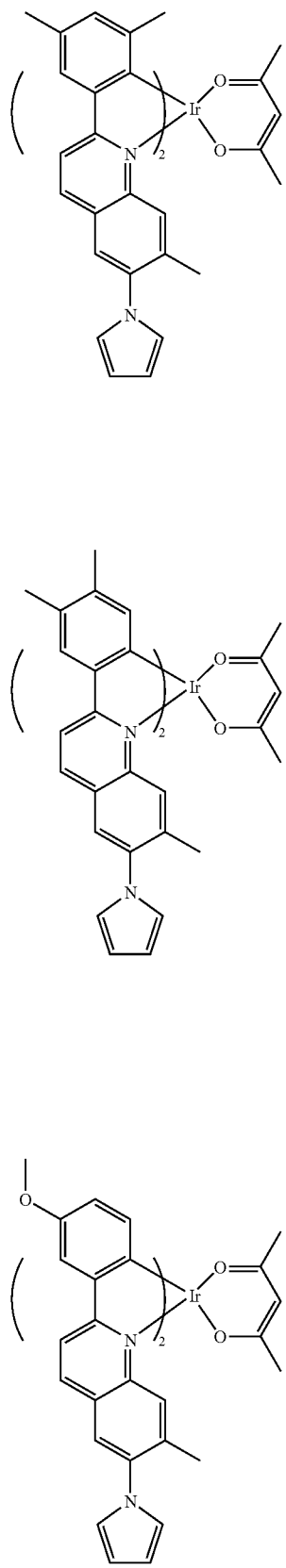
A-14
A-15
A-16

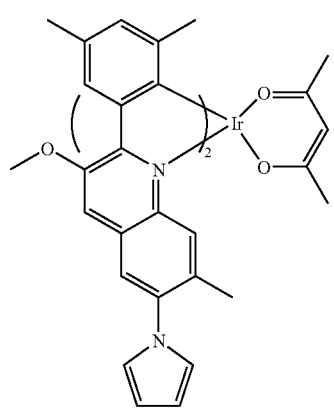
A-17
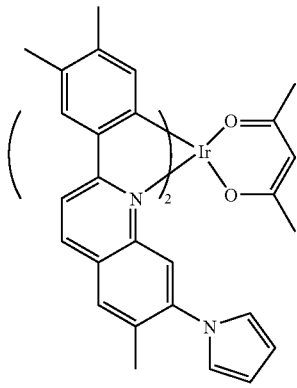
A-21
A-18
A-22
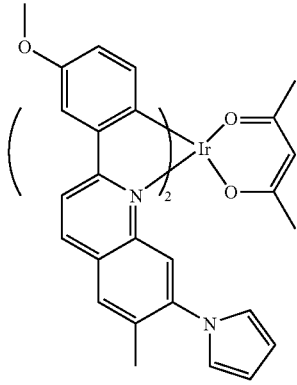
A-19
A-23
A-20
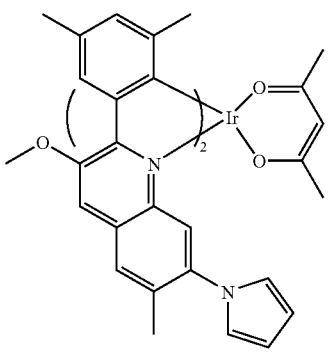
A-24
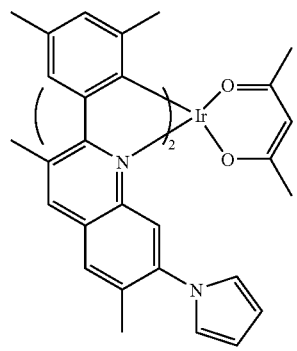

A-25
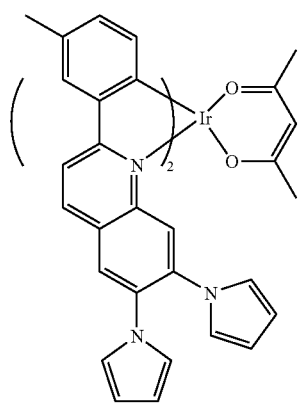
A-26
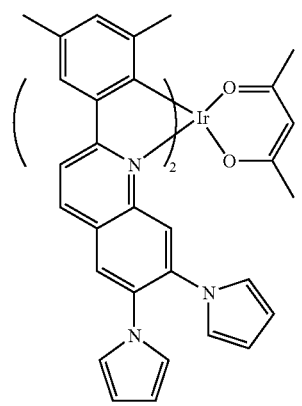
A-27
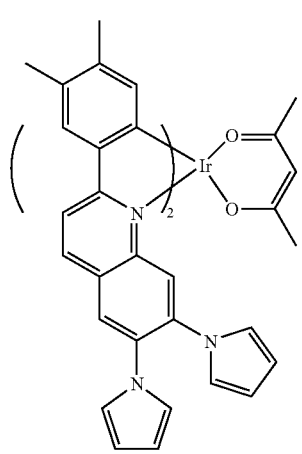
A-28
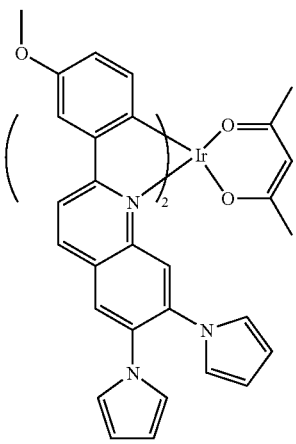
A-29
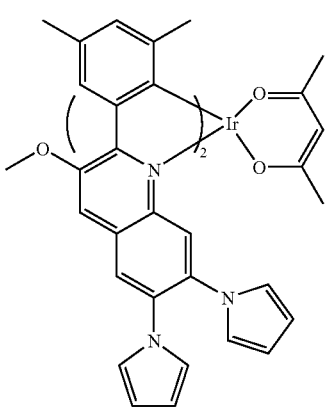
A-30
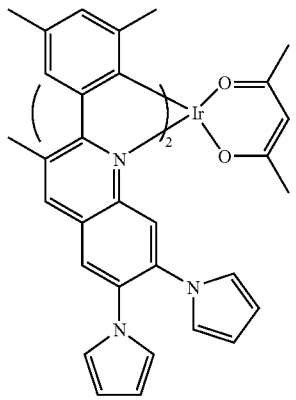
A-31
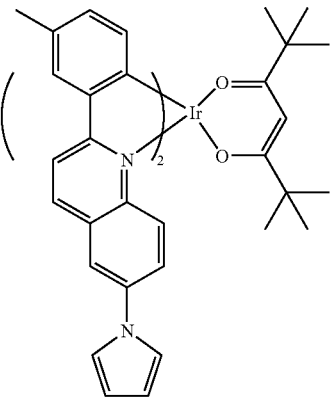

A-32
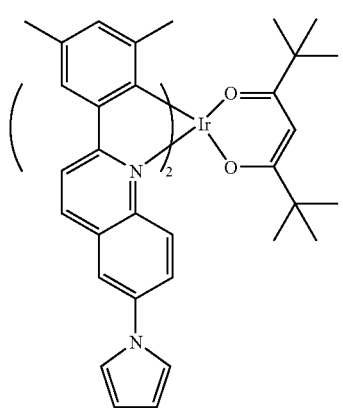
A-33
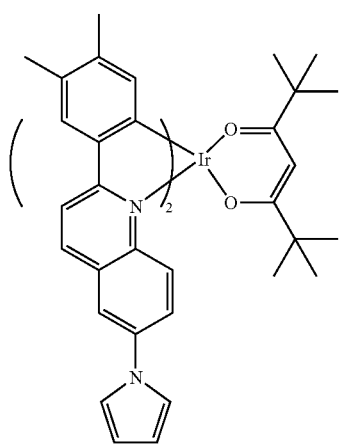
A-34
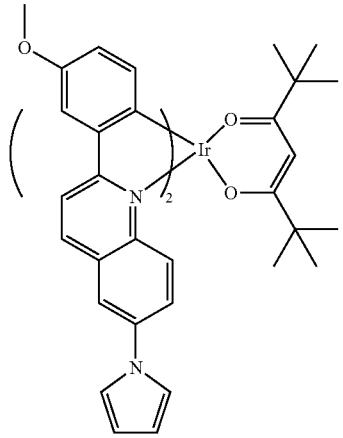
A-35
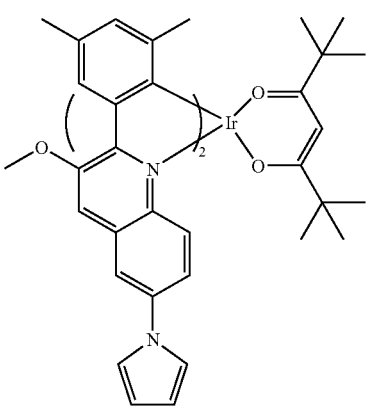
A-36
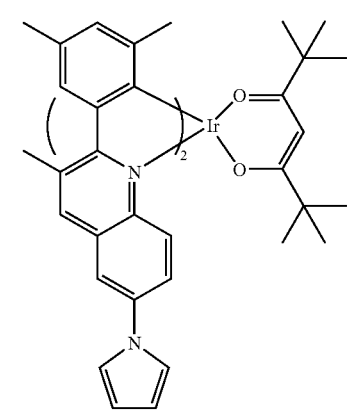
A-37
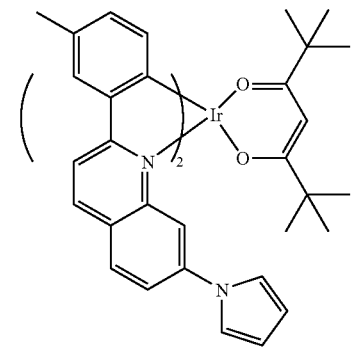
A-38
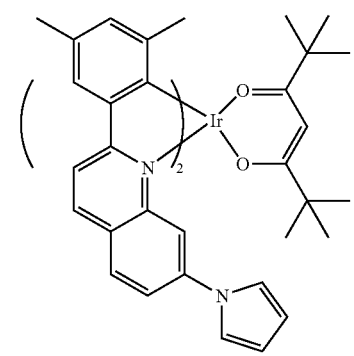

A-39 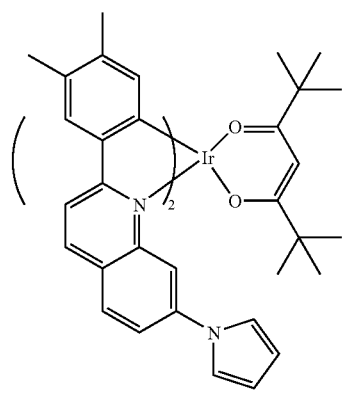
A-40 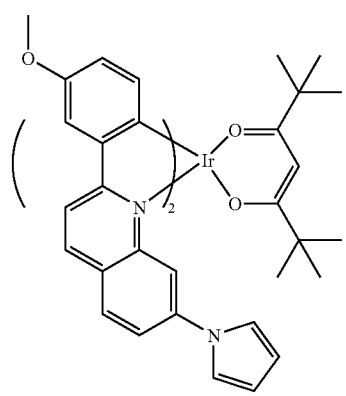
A-41 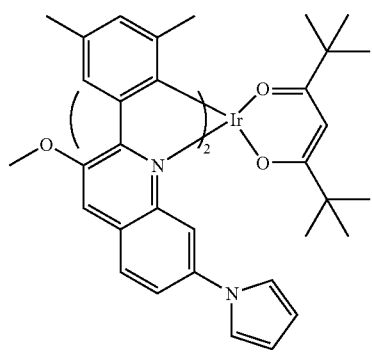
A-42 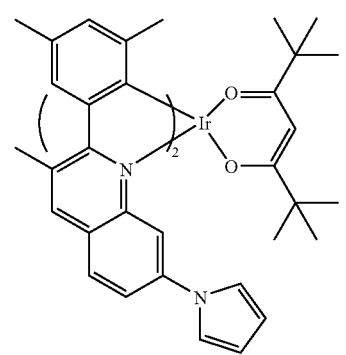
A-43 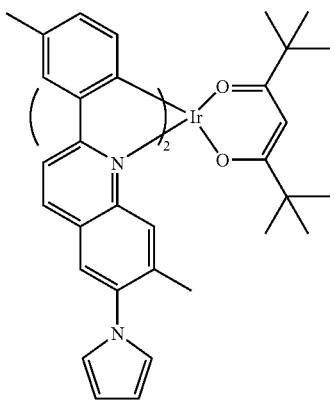
A-44 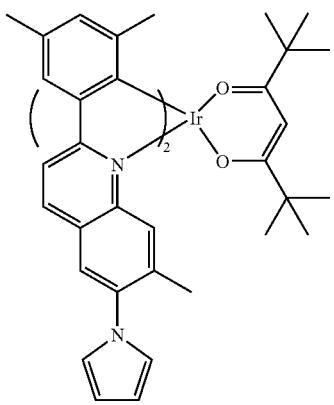
A-45 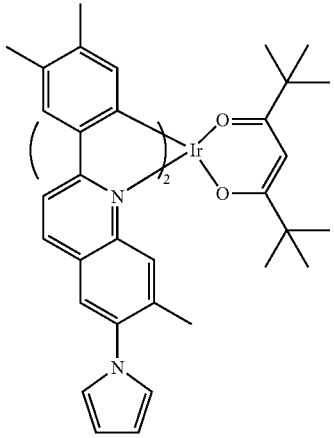
A-46 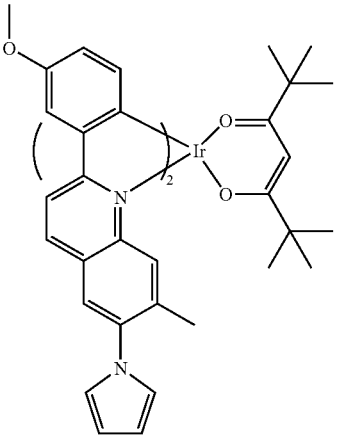

A-47
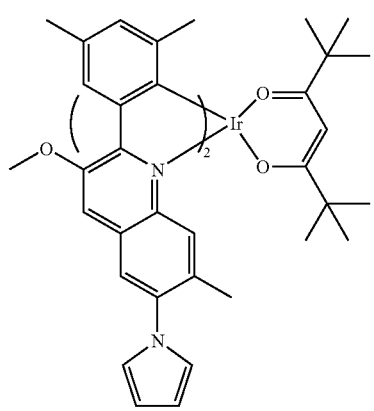
A-48
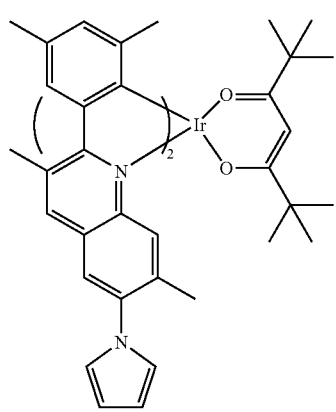
A-49
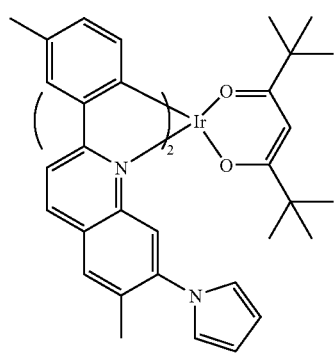
A-50
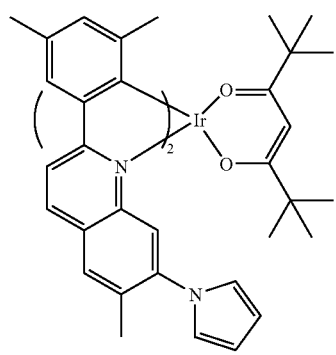
A-51
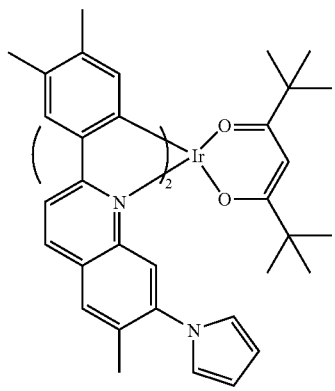
A-52
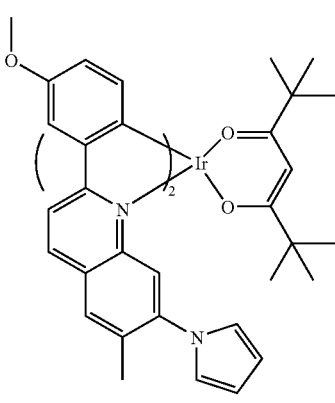
A-53
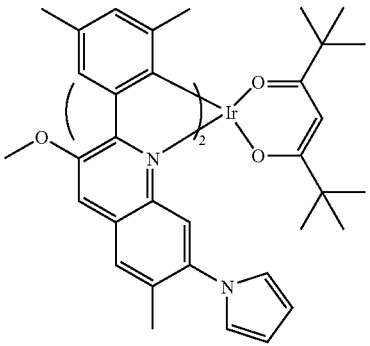
A-54

A-55 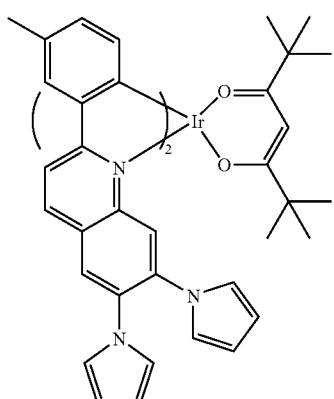

A-56 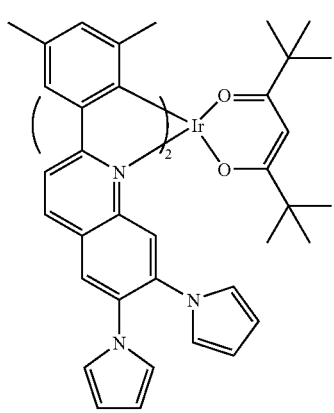

A-57 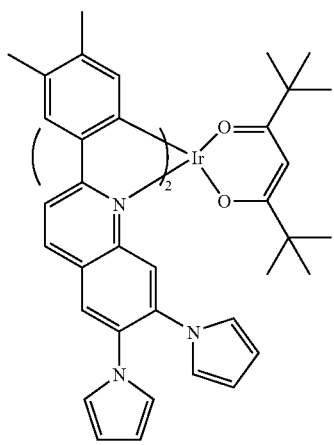

A-58 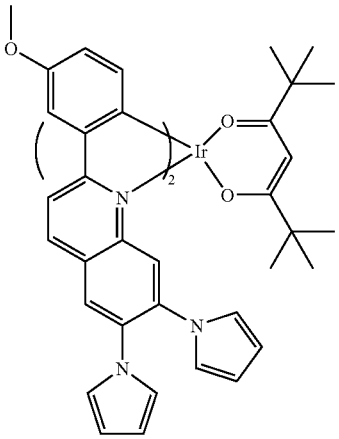

A-59 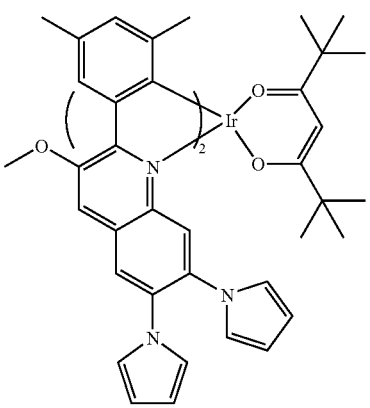

A-60 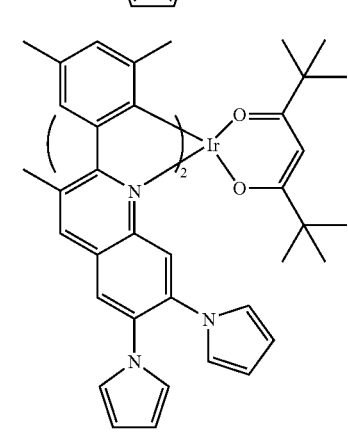

SYNTHESIS EXAMPLE

A synthesis example of the red phosphorescent compound represented by A-1 in the Formula 5 is explained. The red phosphorescent compound of A-1 is iridium(III) {2-(3-methylphenyl)-6-(1H-pyrrole-1-yl)quinoline-N,$C^{2'}$}(2,4-pentanedionate)-0,0).

1. Synthesis of 2-(3-methylphenyl)-6-(1H-pyrrole-1-yl)quinoline 2-(3-methylphenyl)-6-(1H-pyrrole-1-yl)quinoline is synthesized by following Reaction Formula 1.

[Reaction Formula 1]

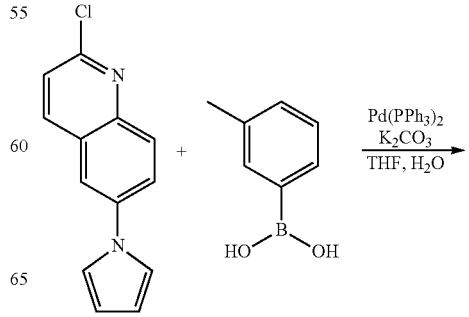

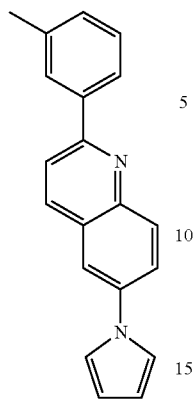

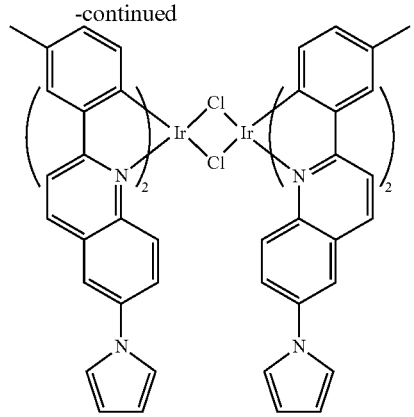

Iridium chloride (5 mmol) and 2-(3-methylphenyl)-6-(1H-pyrrole-1-yl)quinoline (10 mmol) is put in a mixed solvent (30 mL), where a ratio of 2-ethoxyethanol to distilled water is 3:1. The mixture is refluxed for 24 hours, and water is added thereto. The resulting solid is filtered and washed by distilled water to yield chloro-bridged dimmer complex.

3. Synthesis of iridium(III) {2-(3-methylphenyl)-6-(1H-pyrrole-1-yl)quinoline-N,C$^{2'}$}(2,4-pentanedionate-O,O)

3-methylphenyl boronic acid (13 mmol), 2-chloro-6-fluoroquinoline (10 mmol), tetrakis(triphenylphosphine)palladium(0) (0.5 mmol) and potassium carbonate (15 g) are put in a two-neck round-bottom flask and dissolved in tetrahydrofuran (THF) (30 mL) and H$_2$O (10 mL). Subsequently, the resulting solution is stirred in a bath under a temperature of about 100° C. for 24 hours. After completion of the reaction, THF and toluene are removed. The reaction mixture is extracted with dichloromethane and water, and then being distilled under reduced pressure. The resulting residence is filtered by silica gel column and distilled under reduced pressure again. Next, by re-crystallizing and filtering, 2-(3-methylphenyl)-6-(1H-pyrrole-1yl)quinoline (1.4 g) is yielded.

Iridium(III) {2-(3-methylphenyl)-6-(1H-pyrrole-1-yl)quinoline-N,C$^{2'}$}(2,4-pent anedionate-O,O) is synthesized by following Reaction Formula 3.

[Reaction Formula 3]

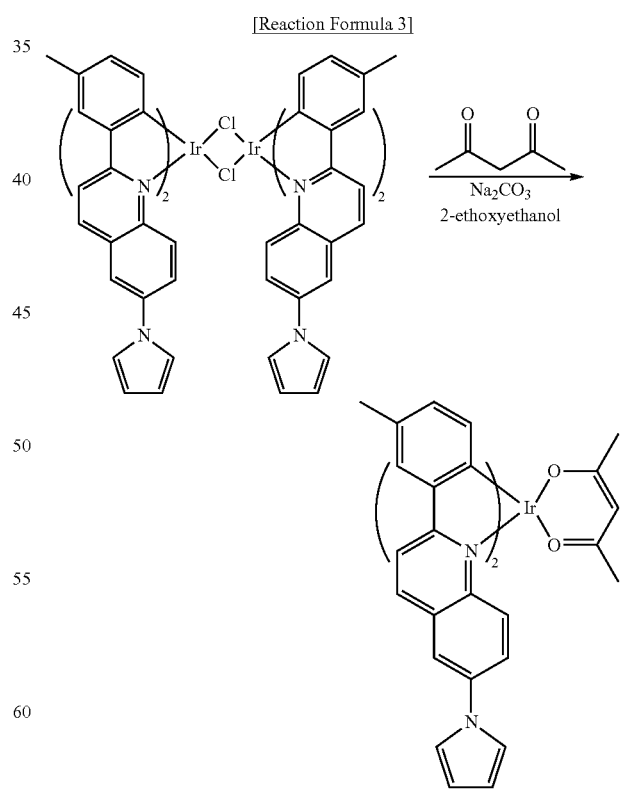

2. Synthesis of Chloro-Bridged Dimmer Complex

Chloro-bridged dimmer complex is synthesized by following Reaction Formula 2.

[Reaction Formula 2]

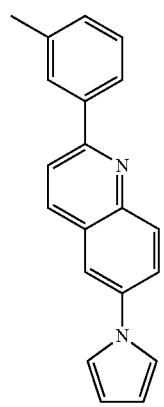 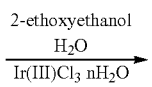

Chloro-bridged dimmer complex (1 mmol), 2,4-pentanedione (3 mmol) and sodium carbonate (Na$_2$CO$_3$) (6 mmol) is put in 2-ethoxyethanol (30 mL), and is refluxed. The resulted mixture is cooled to a room temperature, and then distilled water is added thereto. The mixture is filtered. The resulted solid is dissolved in dichloromethane, and then is filtered by silica gel column. By re-crystallizing the resulted solution using dichloromethane and methanol to yield the red phosphorescent compound of A-1 in Formula 5.

Hereinafter, a detailed description will be made of preferred examples associated with the OELD according to the present invention. More specifically, the examples relate to an OELD including an emission material layer which uses the red phosphorescent compound of Formula 2 as a dopant.

EXAMPLES

Example 1

An indium-tin-oxide (ITO) layer is pattered on a substrate and washed such that an emission area of the ITO layer is 3 mm*3 mm. The substrate is loaded in a vacuum chamber, and the process pressure is adjusted to $1*10^{-6}$ torr. CuPC (about 200 angstroms), 4,4'-bis[N-(1-naphthyl)-N-phenylamino]-biphenyl (NPD) (about 400 angstroms), aluminum(III)bis(2-methyl-8-quinolinato)-4-phenylphenolate (BAlq)+A-1 compound (about 5 weight %) (about 200 angstroms), Alq3 (about 300 angstroms), fluorolithium (LiF) (about 5 angstroms) and aluminum (Al) (about 1000 angstroms) are sequentially formed on the ITO layer such that an OELD is fabricated.

When the A-1 red phosphorescent compound is used as a dopant for an emission layer, the OELD produce a brightness of 1513 cd/m$^2$ at an electric current of 0.9 mA and a voltage of 5.7 V. At this time, the X index and Y index of CIE color coordinates are 0.667 and 0.331, respectively. In addition, the OELD has a lifetime of 5700 hours at 2000 cd/m$^2$. The lifetime is defined as the time taken before the luminance of the OELD decreases to half its initial value.

Example 2

An ITO layer is pattered on a substrate and washed such that an emission area of the ITO layer is 3 mm*3 mm. The substrate is loaded in a vacuum chamber, and the process pressure is adjusted to $1*10^{-6}$ torr CuPC (about 200 angstroms), NPD (about 400 angstroms), BAlq+A-13 compound (about 5 weight %) (about 200 angstroms), Alq3 (about 300 angstroms), LiF (about 5 angstroms) and Al (about 1000 angstroms) are sequentially formed on the ITO layer such that an OELD is fabricated.

When the A-13 red phosphorescent compound is used as a dopant for an emission layer, the OELD produce a brightness of 1595 cd/m$^2$ at an electric current of 0.9 mA and a voltage of 5.6 V. At this time, the X index and Y index of CIE color coordinates are 0.672 and 0.325, respectively. In addition, the OELD has a lifetime of 6800 hours at 2000 cd/m$^2$.

Example 3

An ITO layer is pattered on a substrate and washed such that an emission area of the ITO layer is 3 mm*3 mm. The substrate is loaded in a vacuum chamber, and the process pressure is adjusted to $1*10^{-6}$ torr. CuPC (about 200 angstroms), NPD (about 400 angstroms), BAlq+A-5 compound (about 5 weight %) (about 200 angstroms), Alq3 (about 300 angstroms), LiF (about 5 angstroms) and Al (about 1000 angstroms) are sequentially formed on the ITO layer such that an OELD is fabricated.

When the A-5 red phosphorescent compound is used as a dopant for an emission layer, the OELD produce a brightness of 1012 cd/m$^2$ at an electric current of 0.9 mA and a voltage of 5.4 V. At this time, the X index and Y index of CIE color coordinates are 0.682 and 0.310, respectively. In addition, the OELD has a lifetime of 4500 hours at 2000 cd/m$^2$.

Comparative Example 1

An ITO layer is pattered on a substrate and washed such that an emission area of the ITO layer is 3 mm*3 mm. The substrate is loaded in a vacuum chamber, and the process pressure is adjusted to $1*10^{-6}$ torr. CuPC (about 200 angstroms), NPD (about 400 angstroms), BAlq+[Formula 1-1] compound (about 7 weight %) (about 200 angstroms), Alq3 (about 300 angstroms), LiF (about 5 angstroms) and Al (about 1000 angstroms) are sequentially formed on the ITO layer such that an OELD is fabricated.

When the [Formula 1-1] red phosphorescent compound is used as a dopant for an emission layer, the OELD produce a brightness of 1173 cd/m$^2$ at an electric current of 0.9 mA and a voltage of 6.0 V. At this time, the X index and Y index of CIE color coordinates are 0.606 and 0.375, respectively. In addition, the OELD has a lifetime of 4000 hours at 2000 cd/m$^2$.

Comparative Example 2

An ITO layer is pattered on a substrate and washed such that an emission area of the ITO layer is 3 mm*3 mm. The substrate is loaded in a vacuum chamber, and the process pressure is adjusted to $1*10^{-6}$ torr. CuPC (about 200 angstroms), NPD (about 400 angstroms), BAlq+[Formula 1-2] compound (about 7 weight %) (about 200 angstroms), Alq3 (about 300 angstroms), LiF (about 5 angstroms) and Al (about 1000 angstroms) are sequentially formed on the ITO layer such that an OELD is fabricated.

When the [Formula 1-2] red phosphorescent compound is used as a dopant for an emission layer, the OELD produce a brightness of 780 cd/m$^2$ at an electric current of 0.9 mA and a voltage of 7.5 V. At this time, the X index and Y index of CIE color coordinates are 0.659 and 0.329, respectively. In addition, the OELD has a lifetime of 2500 hours at 2000 cd/m$^2$.

Herein, CuPC, BAlq, Alq3 are represented by following Formulas 6 to 8, respectively. BAlq is used for an emission material layer. However, the emission material layer may be formed of other materials. For example, Al metallic complex, zinc (Zn) metallic complex or CBP may be used for the emission material layer. CBP is a carbazole derivatives and represented by following Formula 9.

[Formula 6]

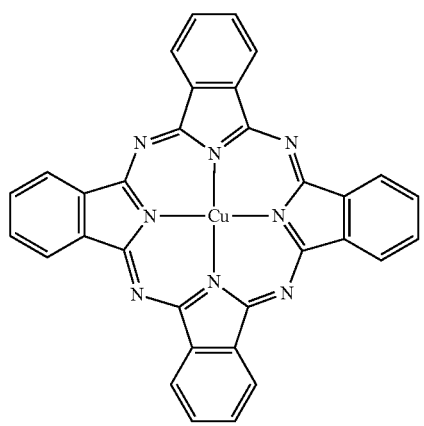

-continued

[Formula 7]

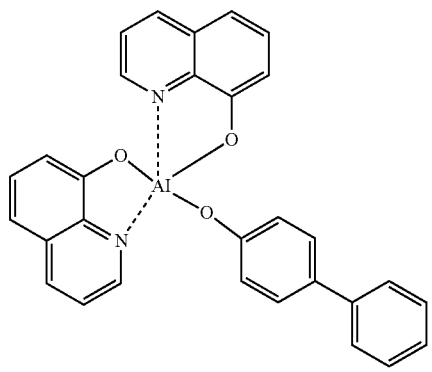

[Formula 8]

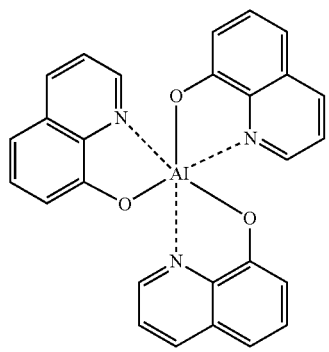

[Formula 9]

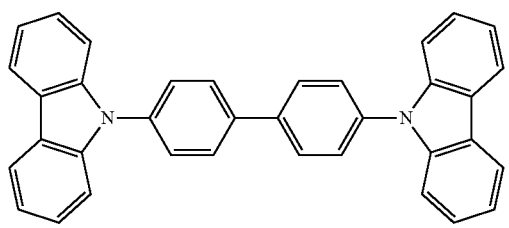

The OELD fabricated in Examples 1 to 3 and Comparative Examples 1 and 2 are evaluated for efficiency, brightness, lifetime, and so on. A voltage has a dimension of [V], an electric current has a dimension of [mA], a brightness has a dimension of [cd/m2], a current efficiency has a dimension of [cd/A], a power efficiency has a dimension of [1 m/W], an internal quantum efficiency has a dimension of [%], and a lifetime has a dimension of [hour]. The evaluated results are shown in Table 1.

TABLE 1

|  | voltage | Electric current | Brightness | Current efficiency | Power efficiency | Internal quantum efficiency | CIE(X) | CIE(Y) | lifetime |
|---|---|---|---|---|---|---|---|---|---|
| Ex. 1 | 5.7 | 0.9 | 1513 | 15.1 | 7.5 | 18.4 | 0.667 | 0.331 | 5700 |
| Ex. 2 | 5.6 | 0.9 | 1595 | 15.9 | 7.2 | 19.5 | 0.672 | 0.325 | 6800 |
| Ex. 3 | 5.4 | 0.9 | 1012 | 10.1 | 8.3 | 18.1 | 0.682 | 0.310 | 4500 |
| Com. Ex. 1 | 6.0 | 0.9 | 1173 | 11.73 | 6.2 | 12.0 | 0.606 | 0.375 | 4000 |
| Com. Ex. 2 | 7.5 | 0.9 | 780 | 7.8 | 3.3 | 10.4 | 0.659 | 0.329 | 2500 |

As shown in TABLE 1, the OELD in Examples 1 to 3 has high color purity (e.g., CIE(X)>0.65) and high internal quantum efficiency. Accordingly, the OELD according to the present invention has improved luminescence efficiency. As a result, when the red phosphorescent compound of the present invention as a dopant for an emission material layer of an OELD, the OELD has high color purity, high brightness and high luminescence efficiency. In addition, the OELD has elongated lifetime.

Figure 2:
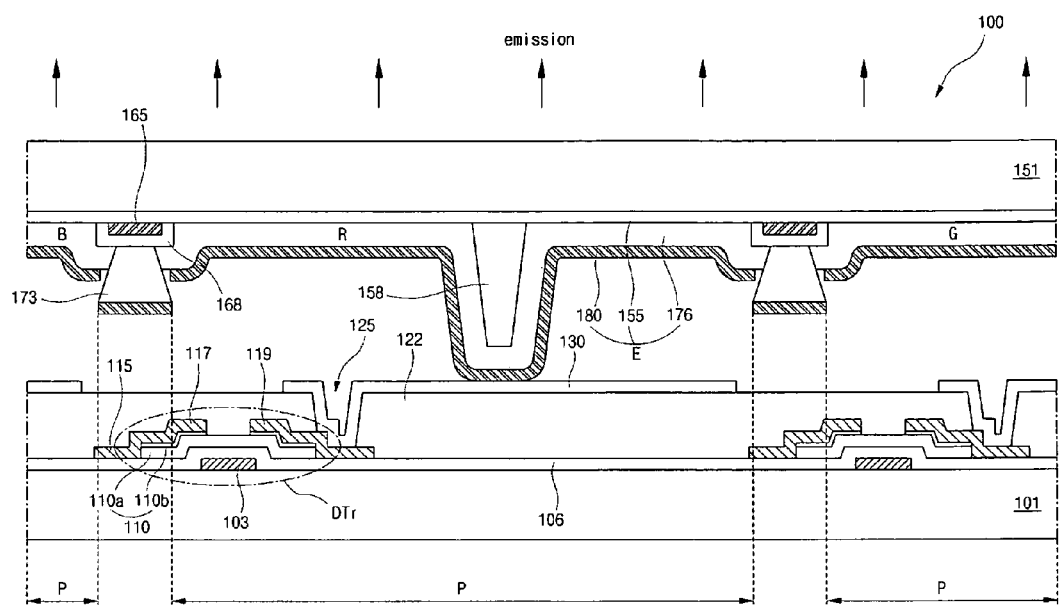
FIG. 2 is a schematic cross-sectional view of an OELD according to the present invention.

FIG. 2 is a schematic cross-sectional view of an OELD according to the present invention. In FIG. 2, an OELD 100 includes a first substrate 101, where a switching element (not shown) and a driving element DTr are formed, and a second substrate 150 where an organic light emitting diode E is formed. Each of the switching element and the driving element DTr may be a thin film transistor.

Although not shown, the first and second substrates 101 and 151 are attached by a seal pattern formed in their boundary. An absorbent is formed inner side of the seal pattern. A gate line and a data line cross each other to define a pixel region P on the first substrate 101. The switching element is formed at a crossing portion of the gate and data lines, and the driving element DTr is connected to the switching element. The driving element DTr includes a gate electrode 103, a gate insulating layer 106, a semiconductor layer 110, a source electrode 117 and a drain electrode 119. For example, the semiconductor layer 110 includes an active layer 110a of intrinsic amorphous silicon and an ohmic contact layer 110b of impurity-doped amorphous silicon. The driving element DTr having a bottom gate type shown in FIG. 2. However, the driving element has a top gate type wherein polycrystalline silicon may be used for the semiconductor layer.

A passivation layer 122 having a drain contact hole 125, which exposes a portion of the drain electrode 119 of the driving element DTr, is formed over the switching element and the driving element DTr. A connection electrode 130 is formed on the passivation layer and contacts the drain electrode 119 of the driving element DTr through the drain contact hole 125.

A first electrode 155 is formed on an entire surface of the second substrate 151. The first electrode 155 is formed of a material having a large work function and serves as an anode. For example, the first electrode 155 may be formed of ITO. A column spacer 158 corresponding to the connection electrode 158 on the first substrate 151 is formed.

An organic emission layer 176 including red, green and blue emission patterns is formed on the first electrode 155. The red, green and blue emission patterns correspond to the pixel region P. A second electrode 180 is formed on the organic emission layer 176 in each pixel region P. The second electrode 180 is formed of a material having a small work function and serves as a cathode. For example, the second electrode 180 may be formed of one of Al and Al alloy (AlNd). The second electrode 180 on the column spacer 158 contacts the connection pattern 130 on the first substrate 101.

In addition, a wall 173 is formed on the first electrode 155. The wall 173 corresponds to boundaries of the pixel region P. Namely, the wall 173 corresponds to the gate and data lines on the first substrate 101. The wall 173 has a reverse taper shape. In more detail, a cross-sectional view of the wall 173 taken along a vertical line to the second substrate 151 has a wide side adjacent to the second substrate 151 and a wide side far to the second substrate 151. Due to the wall 173, the organic emission layer 176 and the second electrode 180 are separated in each pixel region P. A buffer layer 168 may be further formed between the wall 173 and the first electrode 155, and an auxiliary electrode 165 may be further formed between the buffer layer 168 and the first electrode 155. The auxiliary electrode 165 is formed of a low resistance metallic material such that a voltage can be efficiently applied to the first electrode 165. The buffer layer 168 and the auxiliary electrode 165 may be omitted.

Although not shown, to maximize luminescence efficiency, the organic emission layer 176 has a multiple-layered structure. For example, a hole injection layer (HIL), a hole transporting layer (HTL), an emitting material layer (EML), an electron transporting layer (ETL) and an electron injection layer (EIL) are stacked on the first electrode 155. In this case, the red emission pattern of the EML includes a host material, which is capable of transporting an electron and a hole, and the red phosphorescent compound as a dopant. The red phosphorescent compound according to the present invention is represented by the above [Formula 2]. The red phosphorescent compound as a dopant is added with a range of about 0.1 weight % to about 50 weight % with respect to a total weight of a material in the red emission pattern. The host material may be formed of one of BAlq, Al metal complex, Zn metal complex and carbazole derivatives, for example, CBP. A ligand of Al metal complex and Zn metal complex may be one of quinolnyl, biphenylyl, isoquinolnyl, phenylyl, methylquinolnyl, dimethylquinolnyl and dimethyl-iso-quinolnyl. Each of the green and blue emission patterns also includes a phosphorescent compound.

On the other hand, in FIG. 2, the driving element DTr is disposed on the first substrate 101, while the organic luminescent diode E is disposed on the second substrate 151. In addition, since the first electrode 155 is formed of transparent ITO, light from the organic luminescent diode E passes through the second substrate 151. It is called as a top emission type. However, both the driving element DTr and the organic luminescent diode E may be disposed on the same substrate. The second electrode may be formed of a transparent material, while the first electrode may be formed of an opaque material. In this case, light from the organic luminescent diode passes through the first substrate. It is called as a bottom emission type. The OELD of the present invention can be applied to any of the top and bottom emission types.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A red phosphorescent composition, comprising:
a host material being capable of transporting an electron or a hole; and
a dopant material represented by following Formula 1:

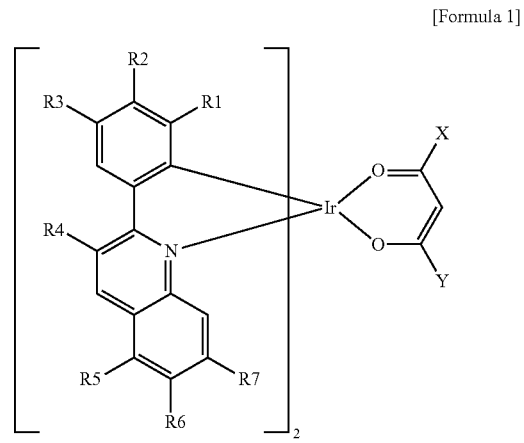

[Formula 1]

wherein each of R1 to R4 is selected from the group consisting of hydrogen atom (H), C1 to C6 alkyl and C1 to C6 alkoxy, and at least one of R1 to R4 is C1 to C6 alkyl, and wherein each of R5 to R7 is selected from the group consisting of hydrogen, C1 to C6 alkyl and pyrrole, and at least one of R5 to R7 is pyrrole, and wherein each of X and Y is selected from the group consisting of H, non-substituted C1 to C6 alkyl and C1 to C6 alkyl substituted by fluorine, wherein nitrogen of pyrrole in at least one of R5 to R7 is combined with quinoline in the Formula 1.

2. The composition according to claim 1, wherein the C1 to C6 alkyl is selected from the group consisting of methyl, ethyl, n-propyl, i-propyl, n-butyl, i-butyl and t-butyl.

3. The composition according to claim 1, wherein the C1 to C6 alkoxy is selected from the group consisting of methoxy, ethoxy, n-propoxy, i-propoxy, n-butoxy, i-butoxy and t-butoxy.

4. The composition according to claim 1, wherein the dopant material has a weight % of about 0.1 to about 50 with respect to a total weight of the composition.

5. The composition according to claim 1, wherein the host material is selected from the group consisting of aluminum (III)bis(2-methyl-8-quinolinato)-4-phenylphenolate (BAlq), Al metal complex, Zn metal complex and carbazole derivative.

6. The composition according to claim 5, wherein the carbazole derivative is 4,4'-N,N'-dicarbazole-biphenyl (CBP).

7. An organic electroluminescent device, comprising:
a first substrate;
a thin film transistor on the first substrate;
a second substrate facing the first substrate; and
an organic luminescent diode electrically connected to the thin film transistor and including a first electrode, a second electrode facing the first electrode and an organic emission layer disposed between the first and second electrodes, a red phosphorescent composition of the organic emission layer including:
a host material being capable of transporting an electron or a hole; and a dopant material represented by following Formula 1:

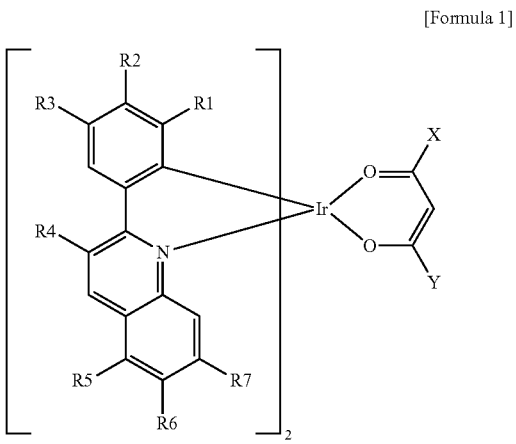

[Formula 1]

wherein each of R1 to R4 is selected from the group consisting of hydrogen atom (H), C1 to C6 alkyl and C1 to C6 alkoxy, and at least one of R1 to R4 is C1 to C6 alkyl, and wherein each of R5 to R7 is selected from the group consisting of hydrogen, C1 to C6 alkyl and pyrrole, and at least one of R5 to R7 is pyrrole, and wherein each of X and Y is selected from the group consisting of H, non-substituted C1 to C6 alkyl and C1 to C6 alkyl substituted by fluorine, wherein nitrogen of pyrrole in at least one of R5 to R7 is combined with quinoline in the Formula 1.

8. The device according to claim 7, wherein the C1 to C6 alkyl is selected from the group consisting of methyl, ethyl, n-propyl, i-propyl, n-butyl, i-butyl and t-butyl.

9. The device according to claim 7, wherein the C1 to C6 alkoxy is selected from the group consisting of methoxy, ethoxy, n-propoxy, i-propoxy, n-butoxy, i-butoxy and t-butoxy.

10. The device according to claim 7, wherein the dopant material has a weight % of about 0.1 to about 50 with respect to a total weight of the composition.

11. The device according to claim 7, wherein the host material is selected from the group consisting of aluminum (III)bis(2-methyl-8-quinolinato)-4-phenylphenolate (BAlq), Al metal complex, Zn metal complex and carbazole derivative.

12. The device according to claim 11, wherein the carbazole derivative is 4,4'-N,N'-dicarbazole-biphenyl (CBP).

13. The device according to claim 7, wherein the organic emission layer has a stacked structure of a hole injection layer, a hole transporting layer, an emission material layer, an electron transporting layer and an electron injection layer.

14. The device according to claim 7, wherein the organic luminescent diode is formed on the first substrate.

15. The device according to claim 7, wherein the organic luminescent diode is formed on the second substrate.

16. The device according to claim 7, wherein the first electrode is disposed between the second substrate and the second electrode and formed of a transparent conductive material.

17. The device according to claim 7, wherein the second electrode is disposed between the first substrate and the first electrode and formed of a transparent conductive material.

* * * * *